United States Patent [19]
Hsu

[11] Patent Number: 5,573,966
[45] Date of Patent: Nov. 12, 1996

[54] METHOD FOR MAKING A READ-ONLY MEMORY DEVICE HAVING TRENCHES

[75] Inventor: Chen-Chung Hsu, Taichung, Taiwan

[73] Assignee: United Microelectronics Corporation, Hsinchu, Taiwan

[21] Appl. No.: 533,103

[22] Filed: Sep. 25, 1995

[51] Int. Cl.$^6$ ................................................. H01L 21/265
[52] U.S. Cl. ................................................. 437/48; 437/52
[58] Field of Search ................................. 437/48, 52, 45, 437/203; 257/390–391

[56] References Cited

U.S. PATENT DOCUMENTS

| | | | |
|---|---|---|---|
| 4,271,421 | 6/1981 | McElroy | 257/390 |
| 5,504,030 | 4/1996 | Chung et al. | 437/52 |
| 5,510,287 | 4/1996 | Chen et al. | 437/52 |

*Primary Examiner*—H. Jey Tsai
*Attorney, Agent, or Firm*—Cushman Darby & Cushman L.L.P.

[57] ABSTRACT

A process for fabricating the memory cells of a read-only memory (ROM) device is disclosed. First, source and drain regions which constitute the bit-lines are formed on a silicon substrate by an ion implanting process. Thereby, channel regions are formed between the abutting bit-lines. Next, portions of the channel regions designated for coding are etched to form trenches. An insulating layer is then formed to fill the trenches. After that, a gate oxide layer is formed on the channel regions. Gate electrodes extending along a direction orthogonal to that of the bit-lines are formed on the substrate to constitute the word-lines. Therefore, the intersecting region of one word-line with two abutting bit-lines constitutes a memory cell of the ROM device. When applying a normal operating voltage, memory cells without the trenches are in an ON state and memory cells with the trenches are in an OFF state since the channel regions are blocked by the insulating layer within the trenches.

10 Claims, 3 Drawing Sheets

5,573,966

METHOD FOR MAKING A READ-ONLY MEMORY DEVICE HAVING TRENCHES

BACKGROUND OF THE INVENTION

1. Field of the Invention

This invention relates in general to a process for fabricating semiconductor memory devices. In particular, this invention relates to a process for fabricating semiconductor read-only memory (ROM) cells by forming trenches on designated channel regions of the cells to turn them off while leaving other cells in the conducting state.

2. Description of Related Art

Read-only memory (ROM) devices, which comprise an array of memory cells, are widely utilized in digital electronic equipment. For example, computer systems including microcomputers and minicomputers use ROM devices for storing fixed software/firmware routines. Usually, the ROM devices are "programmed" with specific codes according to the customer's request. The fabrication process for ROM devices is complicated and requires sophisticated processing steps, each of which consumes precious manufacturing time for material processing and for adjusting manufacturing parameters.

Conventional ROM device memory cells use channel transistors as the electric charge storage components. In the programming stage, impurities are selectively implanted into the designated channel regions. The purpose of this selective impurity implantation is to change the threshold voltage of those "programmed" memory cells, so that the memory cell transistor may be controlled in either an ON or an OFF state to represent the binary bits one and zero respectively, or zero and one respectively, depending on the memory cell supporting logic design.

A brief examination of the specifics of a conventional ROM device helps to explain the present invention. FIG. 1 (Prior Art) of the accompanying drawing shows the top view of a conventional ROM device which exhibits the configuration of several memory cells as observed from above. FIG. 2 (Prior Art) is a cross-sectional view of the conventional ROM device memory cells taken along the II—II line which provides the details of the cells in another perspective.

As is shown in the drawing, a number of memory cells of the conventional ROM device are fabricated on a silicon substrate 10 of, for example, P-type. $N^+$ source/drain regions (that later become bit lines 14) are formed in the designated locations of the silicon substrate 10. The top view of FIG. 1 (Prior Art) clearly shows that the $N^+$ source/drain regions (that later become bit lines 14) are formed as long strips extending in one direction, namely, the vertical direction in the drawing which serve as the bit-lines for the memory cells of the ROM device. A gate oxide layer 12 is then formed over the surface of the silicon substrate 10, and on top of this oxide layer, gate electrodes (that later become word-lines 16) are formed to constitute the word lines for the memory cells in the ROM device. The word-lines 16 are, as is shown in the top view of FIG. 1 (Prior Art), also formed as long strips that extend in the direction substantially orthogonal to the extending direction of the bit lines 14. In this example, the word-lines 16 extend in the horizontal direction in FIG. 1 (Prior Art). Channel regions 18 for the memory cell transistors are formed between every two abutting bit-lines 14 and under each word-line 16. The status of either conducting or blocking of each of the memory cell transistor determines its memory content of either binary one or zero (or either zero or one) respectively.

A ROM device having the basic memory cells as described above has all the memory cell transistors turned on, or, in other words, in the conducting state unless they are programmed with data. To turn off a selected memory cell transistor, its channel region 18 would have to be implanted with P-type impurities. The process of programming the data bits into the selected memory cells of the ROM device is a process referred to as code implantation. Those memory cell transistors with their channel regions implanted with P-type impurities will have increased threshold voltage in the channel region.

However, such ROM devices having the memory cell configuration as described above have at least two disadvantages. Due to the need to reduce the size of virtually every dimension in the device as ROM devices become increasingly miniaturized, it is inevitable that the width of the word lines for the memory cells is also reduced. Such a reduction in the width of word lines 16 result in increased electrical resistance over the cross section of each word line. And, increased electrical resistance directly translates into reduced memory access speed. Furthermore, code implantation is a relatively inaccurate procedure, as the dimensions of the memory cell transistor are reduced. Excessive diffusion of the implants into the designated channel region, as well as implantation location shifting constitute the primary problems of these conventional ROM devices. The operating characteristics exhibited by such faulty memory cells typically include electric current leakage, or a lowering of the breakdown voltage.

SUMMARY OF THE INVENTION

It is therefore an object of the present invention to provide a process for fabricating memory cells of a ROM device which prevents the excessive diffusion and shifting problems of code implantation.

It is another object of the present invention to provide a process for fabricating memory cells of a ROM device which can improve the electrical properties of the memory cells by reducing the leakage current and increasing the breakdown voltage.

The present invention achieves the above-identified objects by providing a process for fabricating memory cells of a read-only memory (ROM) device. First, source and drain regions which constitute the bit-lines are formed on a silicon substrate by an ion-implanting process. Thereby, channel regions are formed between the abutting bit-lines. Next, portions of the channel regions designated for coding are etched to form trenches. An insulating layer is then formed to fill the trenches. After that, a gate oxide layer is formed on the channel regions. Gate electrodes extending along a direction orthogonal to that of the bit-lines are formed on the substrate to constitute the word-lines. Therefore, the intersecting region of one word-line with two abutting bit-lines constitutes a memory cell of the ROM device. When applying a normal operating voltage, memory cells without the trenches are in an ON state and memory cells with the trenches are in an OFF state due to the channel regions are blocked by the insulating layer within the trenches.

BRIEF DESCRIPTION OF THE DRAWINGS

Other objects, features, and advantages of the present invention will become apparent by way of the following detailed description of the preferred but non-limiting

Figure 1:
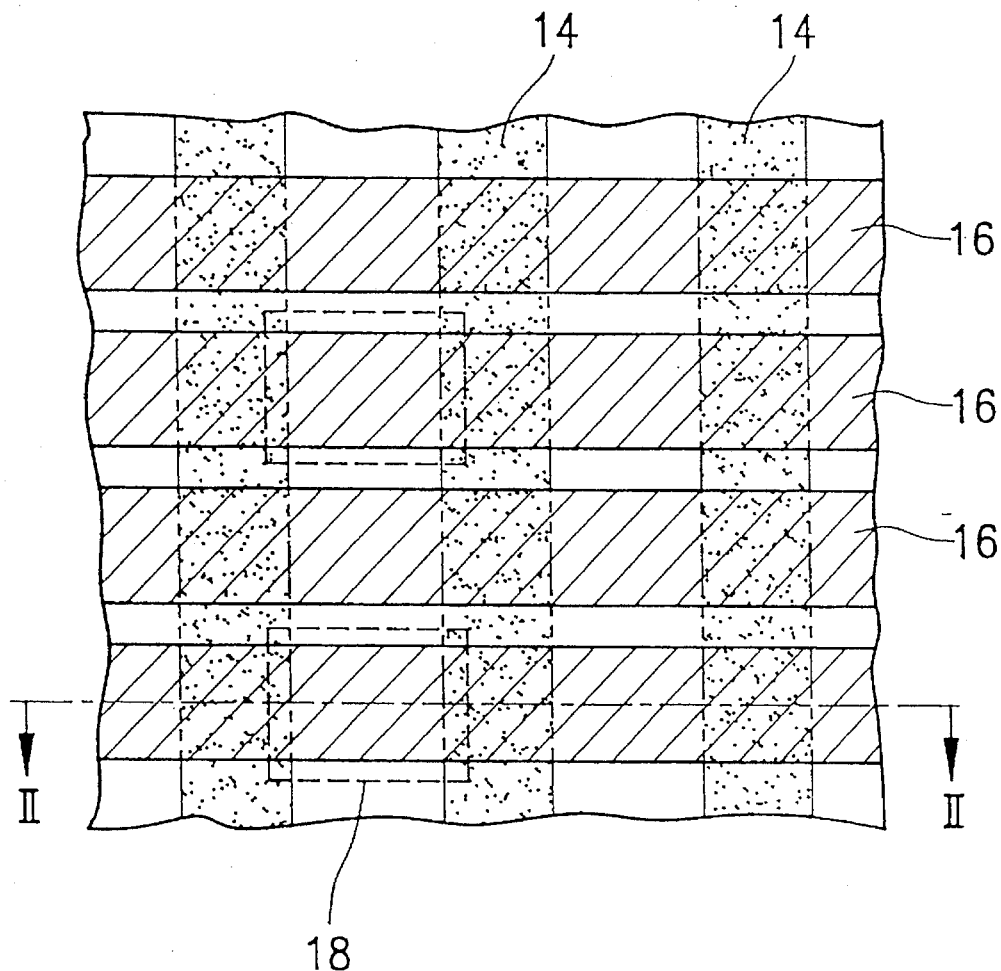
Figure 2:
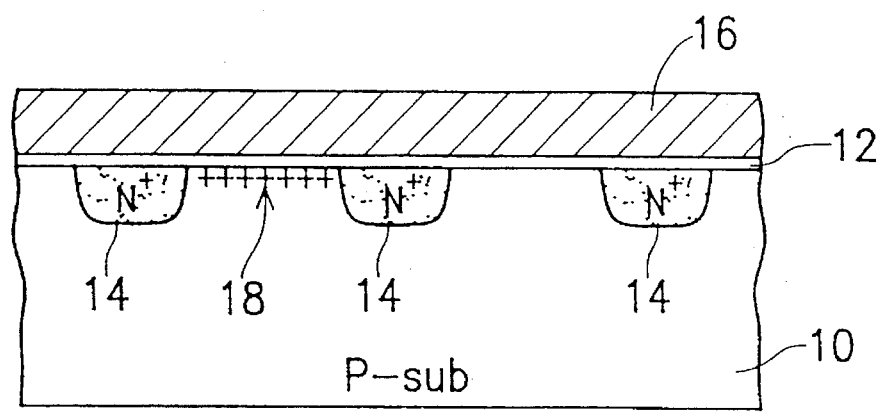

3 embodiments. The description is made with reference to the accompanying drawings in which:

FIG. 1 (Prior Art) is a top view of a conventional ROM device showing the configuration of the memory cells as observed from above;

FIG. 2 (Prior Art) is the cross-sectional view of the memory cells of FIG. 1 (Prior Art) as taken along the II—II line thereof; and FIGS. 3A to 3F are cross-sectional views in the selected stages of the fabricating process in accordance with a preferred embodiment of the present invention.

DETAILED DESCRIPTION OF THE PREFERRED EMBODIMENT

Figure 3A:
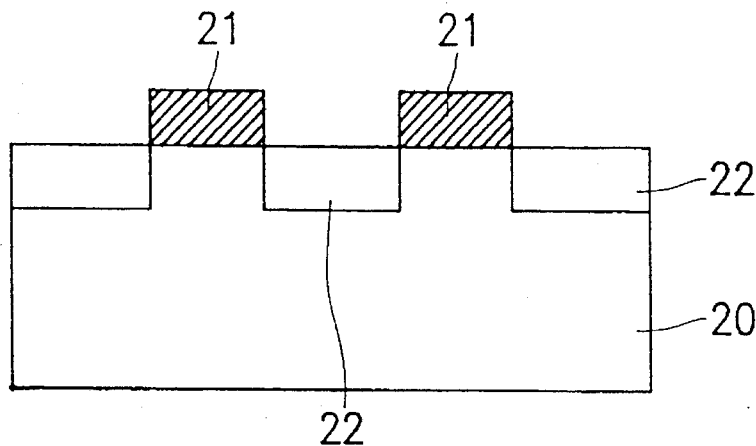
Figure 3B:
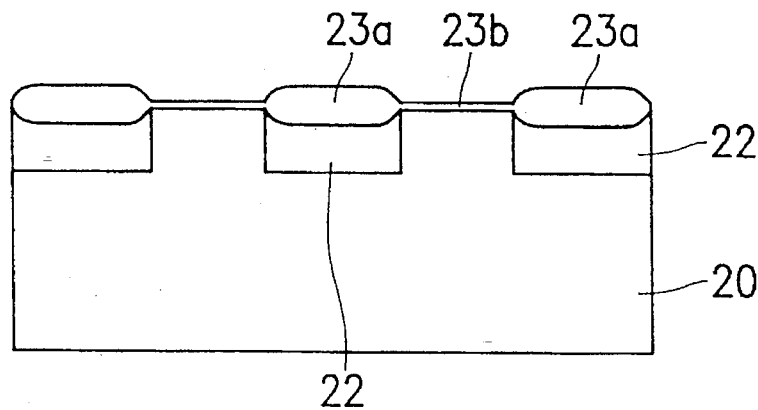

First, referring to FIG. 3A, a semiconductor substrate 20, for example, a P-type silicon substrate is provided for the fabrication of the ROM device of the present invention. A photoresist 21 is coated on the substrate 20 and then patterned by a conventional photolithography process to form a plurality of parallel strips extending along a first direction on the surface of the substrate 20. By using the photoresist 21 as a mask, N type impurities are implanted into the substrate 20 to form a plurality of parallel strip-shaped N⁺ source and drain regions which serve as the bit-lines 22 of the ROM device. For example, N type arsenic ions with an energy of between 50 to 100 KeV are implanted to a dosage of between $1\times10^{14}$ to $1\times10^{16}$ atoms/cm². As can be seen in FIG. 3A, channel regions are automatically formed between every two abutting bit-lines 22. After that, the photoresist 21 is removed by an appropriate solvent Next, referring to FIG. 3B, an oxidation procedure is performed, for example, in an oxygen ambient and at a temperature of between 850° to 950° C., to form a first oxide layer overlying the surface of the substrate 20. The first oxide layer includes a first portion 23a over the bit-lines 22 and a second portion 23b over the channel regions. Due to the difference of oxidation rate between the channel regions and the impurities implanted bit-lines 22, the thickness of the first portion 23a is greater than that of the second portion 23b. For example, the first portion 23a of the first oxide layer has a thickness of between 800 to 1000 Å, and the second portion 23b of the first oxide layer has a thickness of between 250 to 300 Å.

Figure 3C:
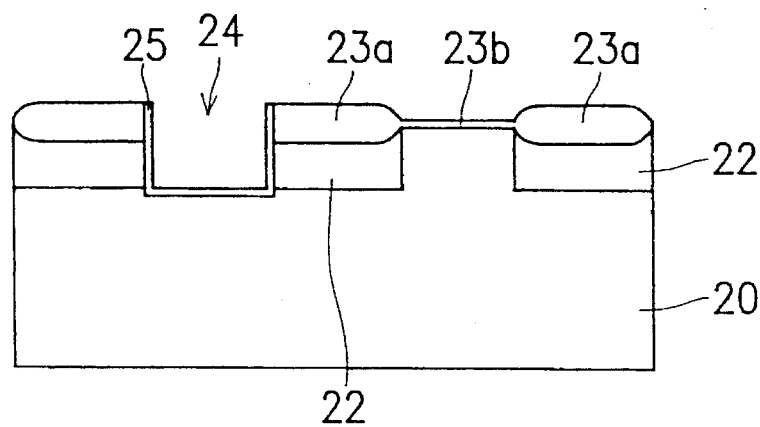

Referring now to FIG. 3C, portions of the channel regions designated for coding of the memory device are etched to form trenches 24. For example, a layer of photoresist (not shown) is first coated and patterned on the substrate 20 to expose the coding areas over the channel regions. Next, trenches 24 with a depth of between 1000 to 3000 Å are formed by etching the coding areas using the photoresist as a mask. Then, the photoresist is removed. After that, a second oxide layer 25 with a thickness of between 500 to 1000 Å is formed on the bottom and sidewalls of the trenches 24 using, for example, a thermal oxidation procedure.

Figure 3D:
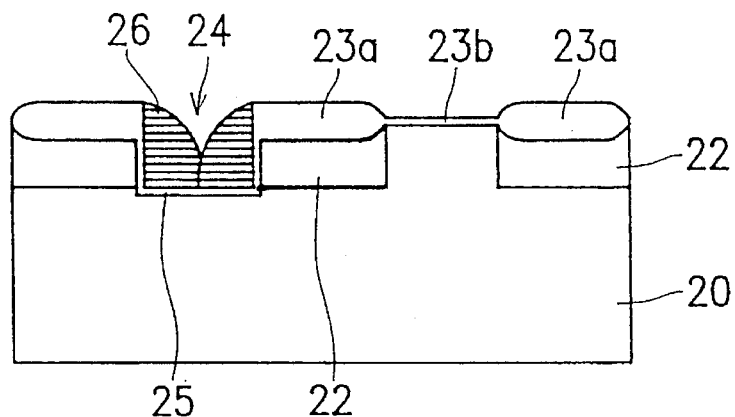

As can be seen in FIG. 3D, the trenches 24 are filled with an insulating layer 26. For example, a layer of insulating material such as silicon dioxide, silicon nitride, or polysilicon is first deposited overlying the entire surface of the substrate 20 including the trenches 24. This layer is then etched back anisotropically to leave the insulating layer 26 filled in the trenches 24.

Figure 3E:
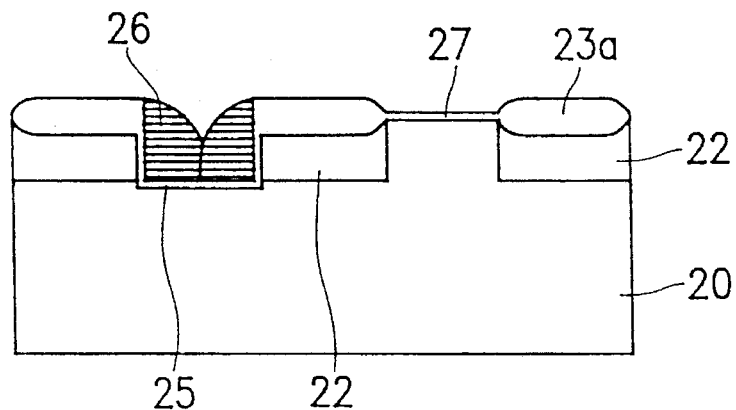

Please refer next to FIG. 3E. An optional step of ion implantation is now performed for adjusting the threshold voltage of the channel regions. For example, BF₂ with an energy of between 30 to 80 KeV is implanted into the channel regions to a dosage of between $1\times10^{12}$ to $1\times10^{13}$ atoms/cm². When performing the ion implantation, the first oxide layer may serve as a buffer layer which prevents the formation of crystal defects in the substrate 20. After that, the second portion 23b of the first oxide layer is etched away to expose the channel regions of the substrate 20. A gate oxide layer 27 is then formed over the channel regions by, for example, deposition or oxidation to a thickness of between 80 to 250 Å.

Figure 3F:
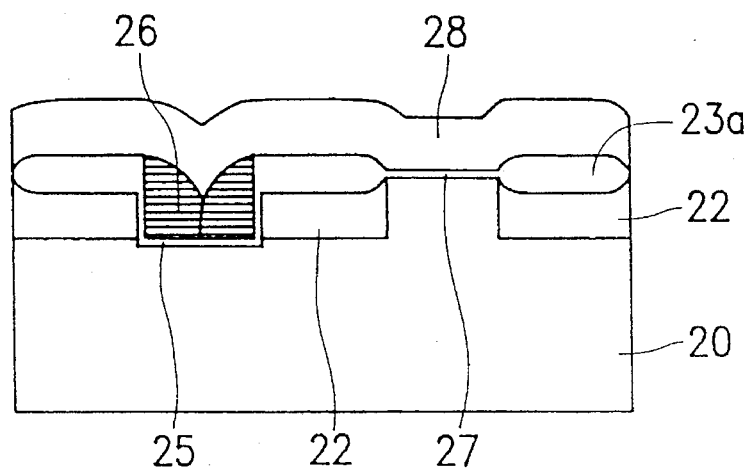

Referring to FIG. 3F, a polysilicon layer is then formed, for example, by chemical vapor deposition (CVD) on the entire surface of the substrate 20 construction, covering both the surfaces of the first oxide layer 23a and the gate oxide layer 27. An ion implantation process can be done to increase the conductivity of this polysilicon layer. For example, phosphoric ions with an energy of between 30 to 60 KeV are implanted into the polysilicon layer to a dosage of between $1\times10^{14}$ to $1\times10^{16}$ atoms/cm². A photolithography procedure is then employed to define the pattern of this polysilicon layer to construct a plurality of parallel and strip-shaped gate electrodes to constitute word-lines 28 of the memory cells. The word-lines 28 extend along a second direction orthogonal to the first direction of the bit-lines 22.

This generally concludes the process of fabrication of the memory cells for the ROM device of the present invention, with the memory contents programmed. The intersecting area of one word line 28 and a pair of abutting bit lines 22 forms a memory cell of the ROM device of the present invention. When applying a normal operating voltage, memory cells without the trenches 24 are conductive, namely in an ON state. Memory cells with the trenches are in an OFF state, under the normal operating voltage, since the channel regions are blocked by the insulating layer 26 within the trenches 24. With the selective ON and OFF status control of the memory cells, the ROM device of the present invention may be "programmed" as is needed for different code/data requirements.

The semiconductor structural configuration of the memory cells for the ROM device of the present invention as depicted in the cross-sectional view of FIG. 3F, may then be subjected to the steps that fabricate components such as metal interconnections and passivation layers to conclude the fabrication of a complete ROM device. All these post processing steps do not concern the scope of the present invention which, as if should be well known by persons skilled in this art, will not be described herein.

Obviously, since no ion implantation procedure is involved in the present fabrication method, the problems of excessive diffusion and shifting that come from the conventional code implantation process can be prevented. Therefore, the electrical properties of the memory cells fabricated in accordance with the above-described preferred embodiment of the present invention are improved because the leakage current is reduced and the breakdown voltage raised.

As persons skilled in this art may well appreciate, the above description of the preferred embodiment of the present invention is employed for the purpose of description, not to restrict the scope of the present invention. Modifications to the outlined embodiment of the present invention may be apparent and should be considered to be within the scope of the present invention that is recited in the claims that follow.

What is claimed is:

1. A process for fabricating memory cells of a read-only memory device (ROM), comprising the steps of:

implanting impurities into a silicon substrate to form a plurality of parallel strip-shaped source and drain regions extending along a first direction to constitute bit-lines of the memory device, thereby forming channel regions between the bit-lines;

oxidizing to form a first oxide layer overlying the bit-lines and the channel regions, a portion of the first oxide layer over the bit-lines having a thickness greater than that of a portion of the first oxide layer over the channel regions;

etching portions of the channel regions designated for coding to form trenches;

forming a second oxide layer on a bottom and sidewalls of the trenches;

forming an insulating layer to fill the trenches;

removing a portion of the first oxide layer over the channel regions without said trenches and forming a gate oxide layer over the channel regions; and forming a plurality of parallel strip-shaped gate electrodes extending along a second direction orthogonal to the first direction on the gate oxide layer and the first oxide layer to constitute word-lines of the memory device, the intersecting region of one word-line with two abutting bit-lines constituting a memory cell of the ROM device.

2. A fabricating process according to claim 1, wherein the step of implanting impurities to form the source and drain regions comprises the step of implanting arsenic ions with an energy of between 50 to 100 KeV to a dosage of between $1 \times 10^{14}$ to $1 \times 10^{16}$ atoms/cm$^2$.

3. A fabricating process according to claim 1 wherein the oxidizing step is carried out in an oxygen ambient and at a temperature of between 850° to 950° C.

4. A fabricating process according to claim 1, wherein portion of the first oxide layer over the bit-lines has a thickness of between 800 to 1000 Å and portion of the first oxide layer over the channel regions has a thickness of between 250 to 300 Å.

5. A fabricating process according to claim 1, wherein the trenches are etched to a depth of between 1000 to 3000 Å.

6. A fabricating process according to claim 1, wherein the second oxide layer has a thickness of between 500 to 1000 Å.

7. A fabricating process according to claim 1 wherein the insulating layer is a material selected from a group consisting of silicon dioxide, silicon nitride, and polysilicon.

8. A fabricating process according to claim 1, further comprising, after forming the insulating layer, the step of ion implanting to adjust the threshold voltage by implanting BF$_2$ with an energy of between 30 to 80 KeV to a dosage of between $1 \times 10^{12}$ to $1 \times 10^{13}$ atoms/cm$^2$.

9. A fabricating process according to claim 1, wherein the gate oxide layer has a thickness of between 80 to 250 Å.

10. A fabricating process according to claim 1, wherein the word-lines are made of polysilicon doped with impurities.

* * * * *